(12) United States Patent
Matsuyama

(10) Patent No.: US 10,410,985 B1
(45) Date of Patent: Sep. 10, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hiroshi Matsuyama, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/054,334

(22) Filed: Aug. 3, 2018

(30) Foreign Application Priority Data

Mar. 23, 2018 (JP) ................. 2018-056220

(51) Int. Cl.
*H01L 23/48* (2006.01)
*H01L 23/00* (2006.01)
*H01L 23/64* (2006.01)
*H01L 25/18* (2006.01)
*H01L 23/053* (2006.01)

(52) U.S. Cl.
CPC ............ *H01L 24/01* (2013.01); *H01L 23/053* (2013.01); *H01L 23/645* (2013.01); *H01L 25/18* (2013.01)

(58) Field of Classification Search
CPC ..... H01L 24/01; H01L 23/053; H01L 23/645; H01L 25/18
USPC ......................................... 257/690
See application file for complete search history.

(56) References Cited

U.S. PATENT DOCUMENTS

| 7,955,902 | B2 * | 6/2011 | Hata | ................. | H01L 23/49562 |
| | | | | | 257/E23.051 |
| 9,059,009 | B2 | 6/2015 | Horio et al. | | |
| 9,640,454 | B2 | 5/2017 | Nashida et al. | | |
| 2015/0373836 | A1 | 12/2015 | Masutani | | |
| 2017/0201188 | A1 | 7/2017 | Ushijima | | |

FOREIGN PATENT DOCUMENTS

| JP | 2016-6806 A | 1/2016 |
| JP | 5971263 B2 | 8/2016 |
| JP | 6112073 B2 | 4/2017 |
| WO | 2016-031052 A1 | 3/2016 |

* cited by examiner

*Primary Examiner* — Tu-Tu V Ho
(74) *Attorney, Agent, or Firm* — White & Case LLP

(57) ABSTRACT

A semiconductor device according to an embodiment includes a frame; a substrate provided inside the frame; a first semiconductor chip provided on the substrate and including a first upper electrode, a first lower electrode, and a first gate electrode; a first polarity electrode having a plate-like shape with a part being provided inside the frame and including a primary first polarity terminal provided outside the frame in a first direction, and a secondary first polarity terminal provided outside the frame in a second direction opposite to the first direction; and a second polarity electrode having a plate-like shape facing the first polarity electrode with a part being provided inside the frame and including a primary second polarity terminal provided outside the frame in the first direction, and a secondary second polarity terminal provided outside the frame in the second direction.

11 Claims, 12 Drawing Sheets

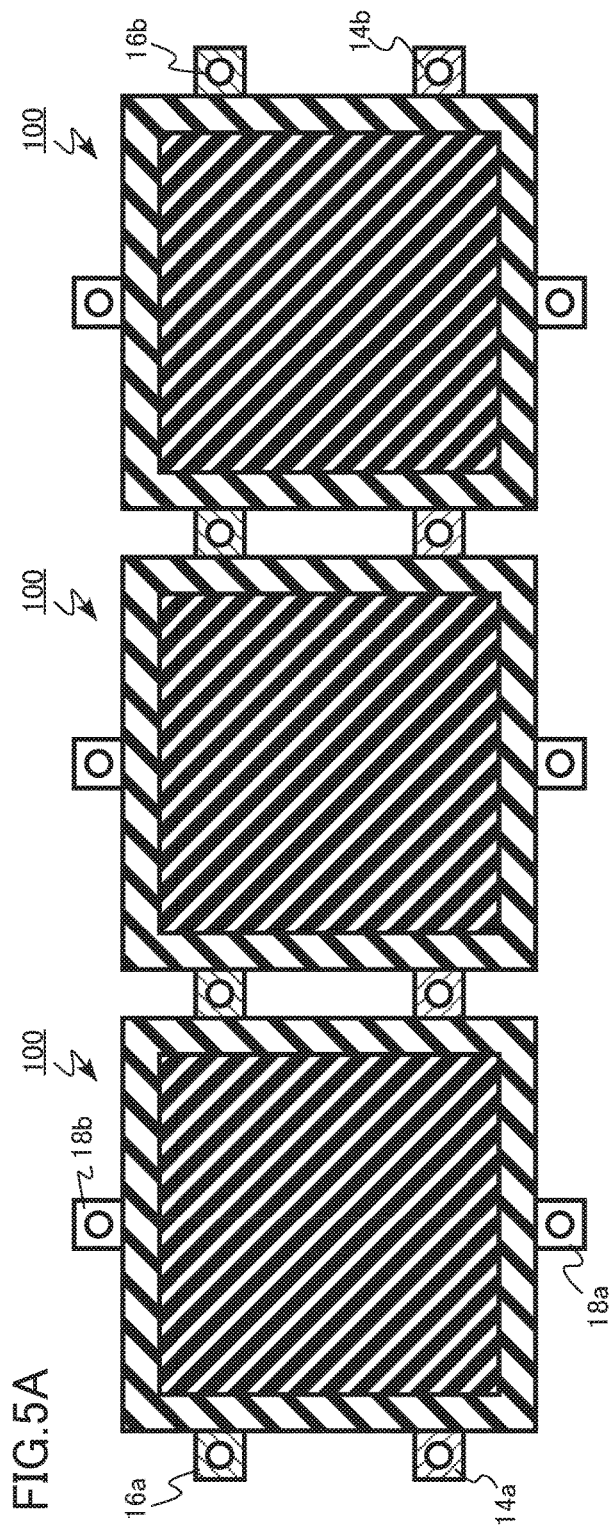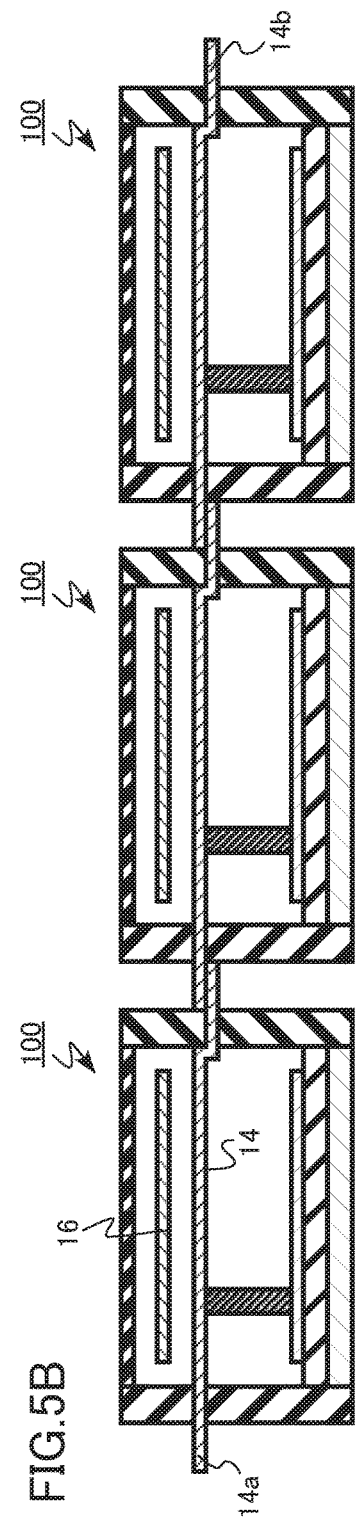

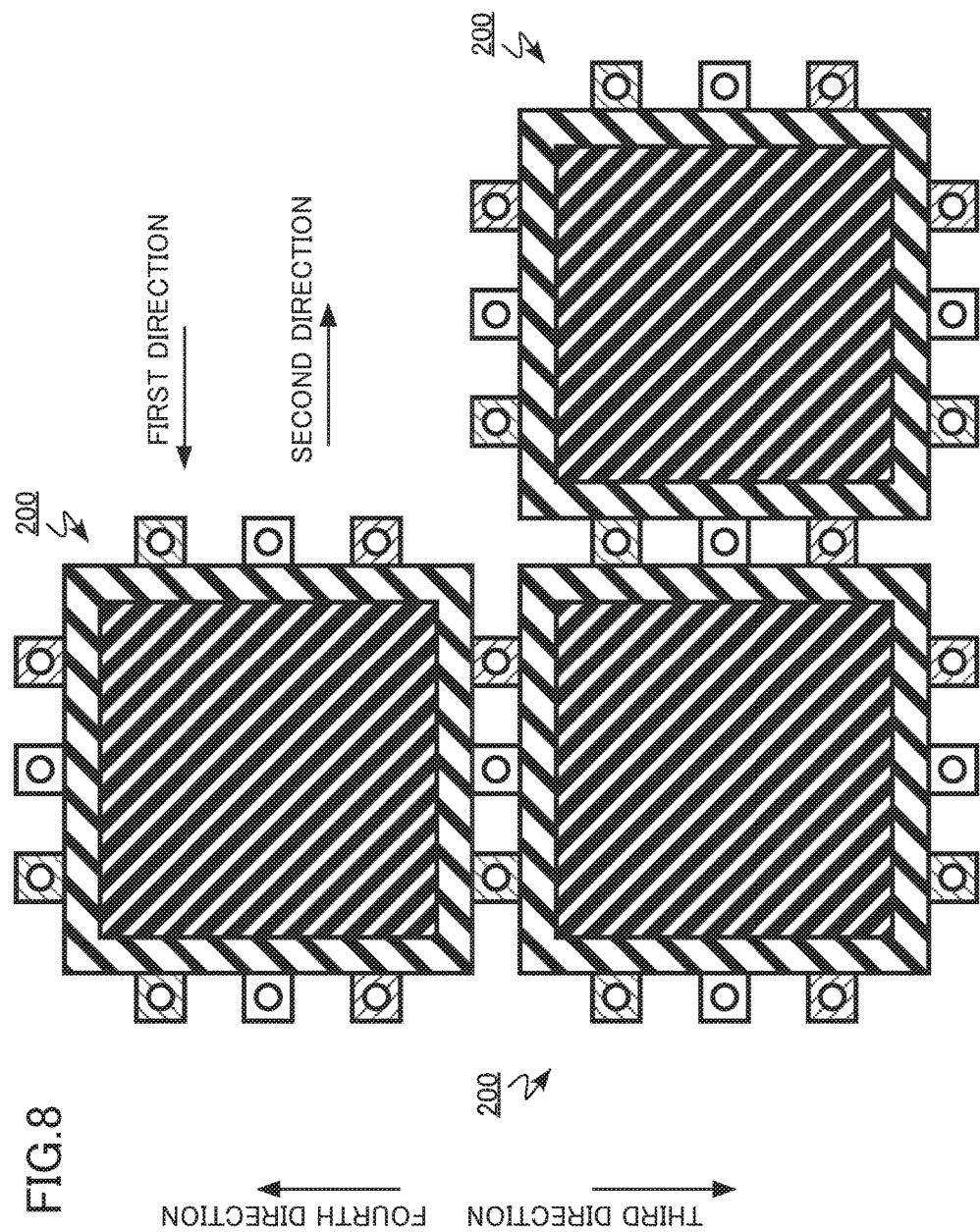

SEMICONDUCTOR DEVICE

CROSS-REFERENCE TO RELATED APPLICATION

This application is based upon and claims the benefit of priority from Japanese Patent Application No. 2018-056220, filed on Mar. 23, 2018, the entire contents of which are incorporated herein by reference.

FIELD

Embodiments described herein relate generally to a semiconductor device.

BACKGROUND

In a power semiconductor module, for example, a plurality of power semiconductor chips is mounted on a metallic substrate with an insulating substrate interposed therebetween. Examples of the power semiconductor chip include a metal oxide field effect transistor (MOSFET), an insulated gate bipolar transistor (IGBT), and a diode.

By connecting a plurality of power semiconductor modules, a circuit such as an inverter circuit can be formed. Large inductance of a circuit including power semiconductor modules causes high switching losses. Therefore, it is desired to reduce inductance of a circuit including power semiconductor modules.

BRIEF DESCRIPTION OF THE DRAWINGS

FIGS. 5A and 5B are explanatory views of function and effect of the semiconductor device according to the first embodiment;

FIG. 8 is an explanatory view of function and effect of the semiconductor device according to the second embodiment;

DETAILED DESCRIPTION

Figure 1A:
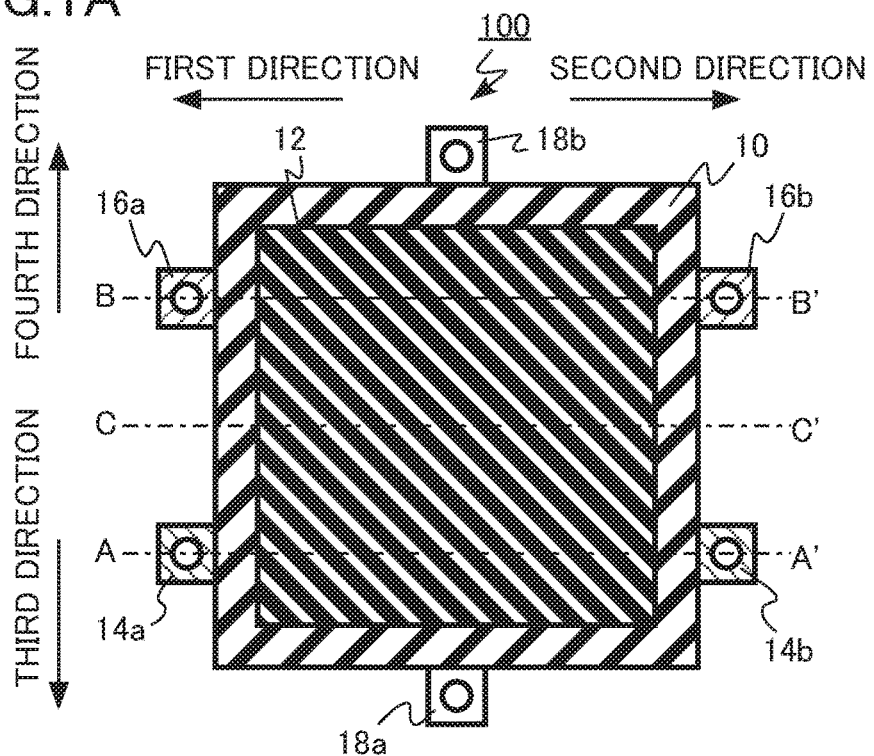
FIGS. 1A and 1B are schematic top views of a semiconductor device according to a first embodiment.

In this specification, the same or similar members are denoted by the same reference numerals, and redundant explanation may be omitted.

Hereinafter, in order to indicate the positional relationship of parts and the like, the terms "on", "upper" may be used to indicate the upper direction of the drawings and the term "below", "lower" to indicate the lower direction of the drawings. It should be noted that the terms "on" and "below" do not indicate the relationship with the direction of gravity.

First Embodiment

A semiconductor device according to a first embodiment includes a frame; a substrate provided inside the frame; a first semiconductor chip provided on the substrate and including a first upper electrode, a first lower electrode, and a first gate electrode; a first polarity electrode having a plate-like shape with a part being provided inside the frame and including a primary first polarity terminal provided outside the frame in a first direction, and a secondary first polarity terminal provided outside the frame in a second direction opposite to the first direction; and a second polarity electrode having a plate-like shape facing the first polarity electrode with a part being provided inside the frame and including a primary second polarity terminal provided outside the frame in the first direction, and a secondary second polarity terminal provided outside the frame in the second direction.

Figure 3A:
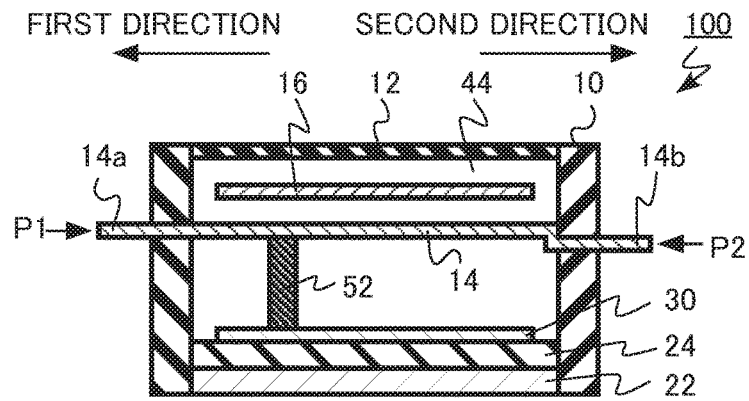
FIGS. 3A, 3B, and 3C are schematic cross-sectional views of the semiconductor device according to the first embodiment.
Figure 3B:
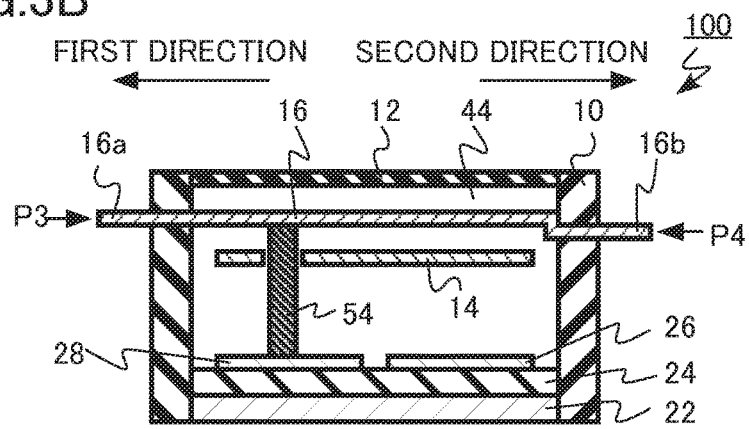
Figure 3C:
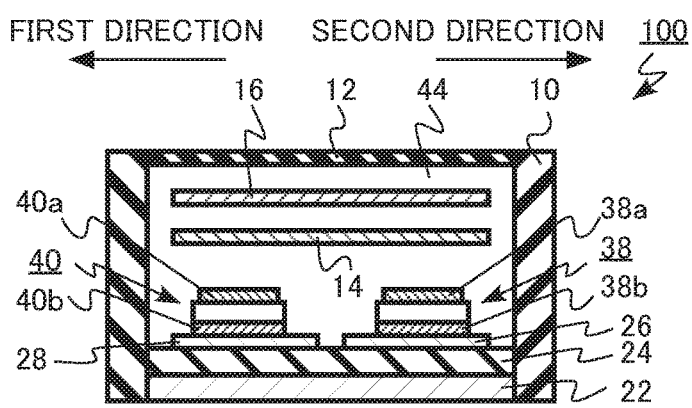
Figure 4:
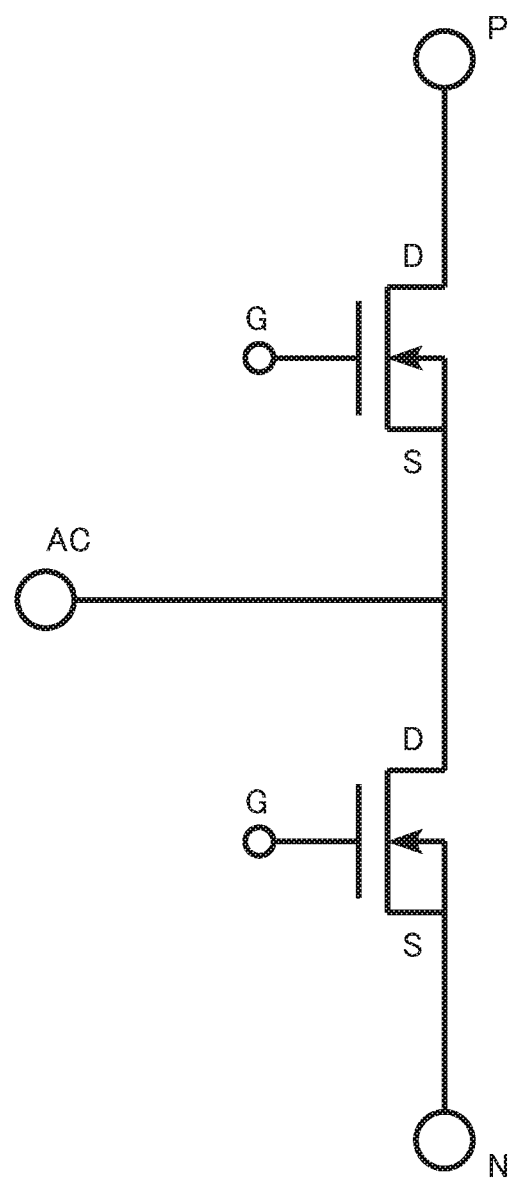
FIG. 4 is an equivalent circuit diagram of the semiconductor device according to the first embodiment.

FIGS. 1A and 1B, and FIGS. 2A and 2B are schematic top views of the semiconductor device according to the first embodiment. FIGS. 3A, 3B, and 3C are schematic cross-sectional views of the semiconductor device according to the first embodiment. FIG. 4 is an equivalent circuit diagram of the semiconductor device according to the first embodiment. Hereinafter, the first polarity electrode will be illustrated as a negative electrode (N electrode) and the second polarity electrode as a positive electrode (P electrode).

The semiconductor device according to the first embodiment is a power semiconductor module 100. As shown in FIG. 4, the power semiconductor module 100 of the first embodiment includes two MOSFETs connected in series. The power semiconductor module 100 of the first embodiment is what is called a "2-in-1" module in which one module forms a half bridge circuit. Using three power semiconductor modules 100 of the first embodiment, for example, leads to the formation of a three-phase inverter circuit.

The power semiconductor module 100 of the first embodiment includes a resin case 10 (frame), cap 12, N electrode 14 (first polarity electrode), first N-terminal 14a (primary first polarity terminal), second N-terminal 14b (secondary first polarity terminal), P electrode 16 (second polarity electrode), first P-terminal 16a (primary second polarity terminal), second P-terminal 16b (secondary second polarity terminal), first AC output terminal 18a (output terminal), second AC output terminal 18b, metallic substrate 22, insulating substrate 24 (substrate), first metallic layer 26, second metallic layer 28, third metallic layer 30, MOSFET 38 (first semiconductor chip), MOSFET 40 (second semiconductor chip), bonding wire 42, silicone gel 44, first metallic plug 52, and second metallic plug 54.

Figure 1B:
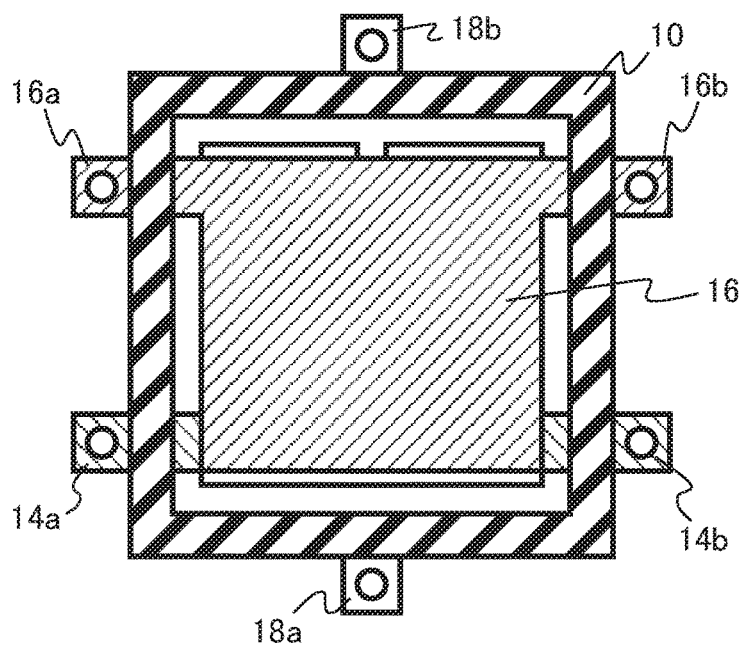

FIG. 1A is a top view of the power semiconductor module 100. FIG. 1B is a top view of the power semiconductor module 100 without the cap 12 and the silicone gel 44.

Figure 2A:
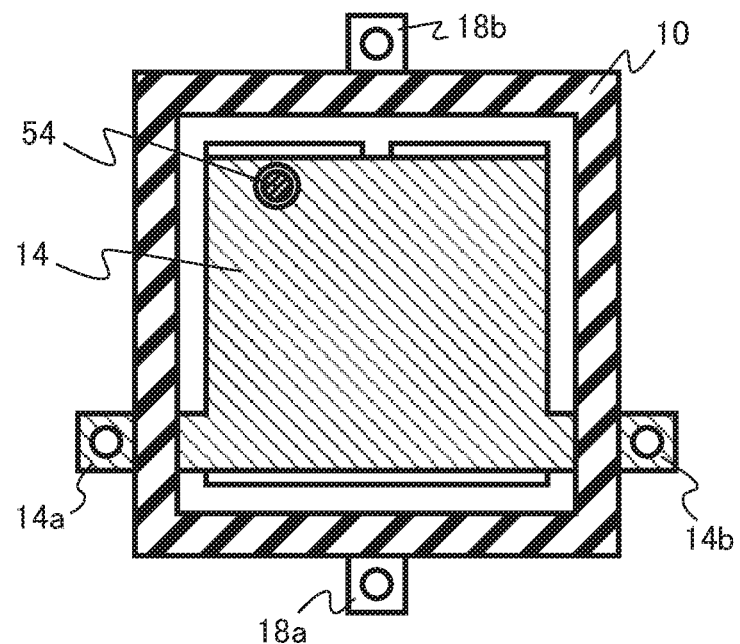
FIGS. 2A and 2B are schematic top views of the semiconductor device according to the first embodiment.
Figure 2B:
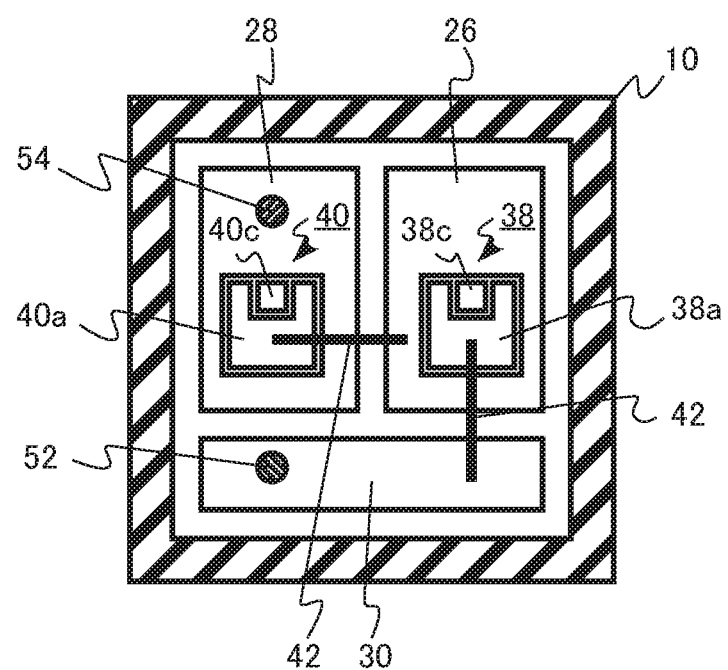

FIG. 2A is a top view of the power semiconductor module 100 without the cap 12, P electrode 16 (second polarity electrode), and silicone gel 44. FIG. 2B is a top view of the power semiconductor module 100 without the cap 12, P electrode 16, N electrode 14, AC output terminal 18, and silicone gel 44.

FIG. 3A is a cross-sectional view taken along line AA' of FIG. 1A. FIG. 3B is a cross-sectional view taken along line BB' of FIG. 1A. FIG. 3C is a cross-sectional view taken along line CC' of FIG. 1A.

The metallic substrate 22 includes, for example, copper. When mounting the semiconductor module on a product, for example, a heat sink (not shown) is connected to a back face of the metallic substrate 22.

The resin case 10 is provided around the metallic substrate 22. The resin case 10 is made of resin. The cap 12 is provided on the resin case 10. The inside of the power semiconductor module 100 is filled with the silicone gel 44 serving as a sealing material. The resin case 10, metallic substrate 22, cap 12, and silicone gel 44 are configured to protect or insulate the members in the power semiconductor module 100.

The insulating substrate 24 is provided inside the resin case 10. The insulating substrate 24 is provided on the metallic substrate 22. The insulating substrate 24 is configured to insulate the metallic substrate 22 from the first metallic layer 26, second metallic layer 28, and third metallic layer 30. The insulating substrate 24 includes resin that contains a filler having high thermal conductivity and formed of boron nitride or the like. The insulating substrate 24 includes, for example, aluminum nitride (AlN), a high thermal conductive material.

The first metallic layer 26, second metallic layer 28, and third metallic layer 30 are provided on the insulating substrate 24. The first metallic layer 26, second metallic layer 28, and third metallic layer 30 include, for example, copper.

The MOSFET 38 is provided on the first metallic layer 26. The MOSFET 38 is connected to the first metallic layer 26 by, for example, solder or Ag nanoparticles. The MOSFET 38 has an upper face provided with a source electrode 38a (first upper electrode) and a gate electrode 38c (first gate electrode), and a lower face provided with a drain electrode 38b (first lower electrode).

The MOSFET 40 is provided on the second metallic layer 28. The MOSFET 38 is connected to the second metallic layer 28 by, for example, solder or Ag nanoparticles. The MOSFET 40 has an upper face provided with a source electrode 40a (second upper electrode) and a gate electrode 40c (second gate electrode), and a lower face provided with a drain electrode 40b (second lower electrode).

The MOSFETs 38 and 40 are semiconductor chips including a compound semiconductor such as silicon carbide (SiC), silicon (Si), or gallium nitride (GaN).

The N electrode 14 has a plate-like shape. The N electrode 14 includes the first N-terminal 14a and the second N-terminal 14b. A part of the N electrode 14 is provided inside the resin case 10. A part of the N electrode 14 is surrounded by the silicone gel 44.

The first N-terminal 14a is provided outside the resin case 10. The first N-terminal 14a extends in a first direction with respect to the resin case 10.

The second N-terminal 14b is provided outside the resin case 10. The second N-terminal 14b extends in a second direction, opposite to the first direction, with respect to the resin case 10.

The first N-terminal 14a and the second N-terminal 14b are on two different planes both having the normal line of the insulating substrate 24. For example, the first N-terminal 14a is on a plane P1 shown in FIG. 3A, and the second N-terminal 14b is on a plane P2 shown in FIG. 3A. The planes P1 and P2 are different planes. In other words, the first N-terminal 14a and the second N-terminal 14b are provided at different heights from the insulating substrate 24.

The N electrode 14 is electrically connected to the third metallic layer 30 by the metallic plug 52.

The P electrode 16 has a plate-like shape. The P electrode 16 includes the first P-terminal 16a and the second P-terminal 16b. A part of the P electrode 16 is provided inside the resin case 10. A part of the P electrode 16 is surrounded by the silicone gel 44.

The first P-terminal 16a is provided outside the resin case 10. The first P-terminal 16a extends in the first direction with respect to the resin case 10.

The second P-terminal 16b is provided outside the resin case 10. The second P-terminal 16b extends in the second direction, opposite to the first direction, with respect to the resin case 10.

The first P-terminal 16a and the second P-terminal 16b are on two different planes both having the normal line of the insulating substrate 24. For example, the first P-terminal 16a is on a plane P3 shown in FIG. 3B, and the second P-terminal 16b is on a plane P4 shown in FIG. 3B. The planes P3 and P4 are different planes. In other words, the first P-terminal 16a and the second P-terminal 16b are provided at different heights from the insulating substrate 24. It should be noted that the planes P3 and P4, for example, are planes different from the planes P1 and P2.

The P electrode 16 is electrically connected to the second metallic layer 28 by the metallic plug 54. The metallic plug 54 penetrates through the N electrode 14.

At least a part of the P electrode 16 faces at least a part of the N electrode 14. The N electrode 14 and the P electrode 16 have regions that face each other in parallel. In other words, a part of the N electrode 14 and a part of the P electrode form parallel flat plates.

A positive voltage, for example, is applied to the P electrode 16 from the outside. A negative voltage, for example, is applied to the N electrode from the outside.

The first AC output terminal 18a is provided outside the resin case 10. The first AC output terminal 18a extends in a third direction, perpendicular to the first direction, with respect to the resin case 10.

The second AC output terminal 18b is provided outside the resin case 10. The second AC output terminal 18b extends in a fourth direction, opposite to the third direction, with respect to the resin case 10.

The power semiconductor module 100 includes, for example, a first gate terminal (not shown) and a second gate terminal (not shown). The first gate terminal is, for example, electrically connected to the gate electrode 38c. The second gate terminal is, for example, electrically connected to the gate electrode 40c.

The N electrode 14, P electrode 16, first AC output terminal 18a, second AC output terminal 18b, first gate terminal, and second gate terminal are made of metal. The N electrode 14, P electrode 16, first AC output terminal 18a, second AC output terminal 18b, first gate terminal, and second gate terminal include, for example, copper or copper alloy.

The source electrode 38a of the MOSFET 38 is connected to the third metallic layer 30 by the bonding wire 42. The N electrode 14 is electrically connected to the source electrode 38a through the metallic plug 52, third metallic layer 30, and bonding wire 42.

The P electrode 16 is electrically connected to the drain electrode 40b through the metallic plug 54 and the second metallic layer 28.

The first AC output terminal 18a and the second AC output terminal 18b are connected to the drain electrode 38b and the source electrode 40a through a bonding wire (not shown) and the first metallic layer 26.

Hereinafter, function and effect of the semiconductor device of the first embodiment will be described.

By connecting a plurality of power semiconductor modules, a circuit such as an inverter circuit can be formed. Large inductance of a circuit including power semiconductor modules causes an over voltage, or what is called a surge voltage, when switching off a semiconductor chip at high speed. When a breakdown voltage of the semiconductor chip is designed to be high with the surge voltage in mind, the on-resistance of the semiconductor chip increases, which causes an increase in conduction losses of the circuit. Furthermore, elongation of the time of off action may decrease the surge voltage but increases switching losses of the circuit. Therefore, it is desired to reduce inductance of a circuit including power semiconductor modules.

With regard to a "2-in-1" power semiconductor module in which one module forms a half bridge circuit, for example, connecting three modules in parallel forms a three-phase inverter circuit. In this case, terminals of each power semiconductor module are connected with a bus bar. In this case, inductance of the bus bar is added to inductance inside each power semiconductor module, which causes an increase in inductance of the circuit that includes the power semiconductor modules.

FIGS. 5A and 5B are explanatory views of function and effect of the semiconductor device according to the first embodiment. FIG. 5A is a schematic top view when three power semiconductor modules 100 are connected in parallel. FIG. 5B is a schematic cross-sectional view when three power semiconductor modules 100 are connected in parallel. FIG. 5B is a cross-sectional view corresponding to FIG. 3A.

The power semiconductor module 100 includes the resin case 10 having both sides provided with terminals of the N electrode 14. In other words, the first N-terminal 14a is provided on one side of the resin case 10 and the second N-terminal 14b is provided on the other side. Furthermore, the power semiconductor module 100 includes the resin case 10 having both sides provided with terminals of the P electrode 16. In other words, the first P-terminal 16a is provided on one side of the resin case 10 and the second P-terminal 16b is provided on the other side.

As shown in FIGS. 5A and 5B, the first N-terminal 14a and the second N-terminal 14b of adjacent power semiconductor modules 100 are connected, and the first P-terminal 16a and the second P-terminal 16b of adjacent power semiconductor modules 100 are connected to each other. Such a configuration enables connection between terminals of power semiconductor modules without a bus bar. Accordingly, inductance of a circuit including the power semiconductor modules is reduced.

It should be noted that the terminals of the adjacent power semiconductor modules 100 can be connected to each other, for example, with a connecting screw (not shown).

Inductance of wires includes self-induced self-inductance and mutually-induced mutual-inductance. Inductance of wires is the sum of self-inductance and mutual-inductance. For example, inductance of the N electrode 14 and that of the P electrode 16 indicate self-inductance of each of the N electrode 14 and the P electrode 16, and mutual-inductance accompanying mutual induction of the N electrode 14 and the P electrode 16.

In each power semiconductor module 100, a part of the N electrode 14 and a part of the P electrode 16 form parallel flat plates. Therefore, mutual-inductance functions in a direction that cancels self-inductance. Such an action reduces the inductance of the N electrode 14 and that of the P electrode 16. Accordingly, the inductance inside each power semiconductor module 100 is also reduced. Thus, the inductance of the circuit including the power semiconductor modules 100 is reduced.

As described above, according to the first embodiment, a bus bar is not required for connection of the power semiconductor modules 100 so that it is possible to reduce the inductance of the circuit including the power semiconductor modules 100. Furthermore, forming a part of the N electrode 14 and a part of the P electrode 16 into parallel flat plates reduces the inductance of the circuit including the power semiconductor modules 100.

Second Embodiment

A semiconductor device according to a second embodiment is different from the semiconductor device according to the first embodiment in that a first polarity electrode includes a tertiary first polarity terminal provided outside the frame extending in a third direction perpendicular to the first direction, and a quaternary first polarity terminal provided outside the frame extending in a fourth direction opposite to the third direction, and that a second polarity electrode includes a tertiary second polarity terminal provided outside the frame extending in the third direction perpendicular to the first direction, and a quaternary second polarity terminal provided outside the frame extending in the fourth direction opposite to the third direction. Hereinafter, contents overlapping with the first embodiment will not be described.

Figure 6:
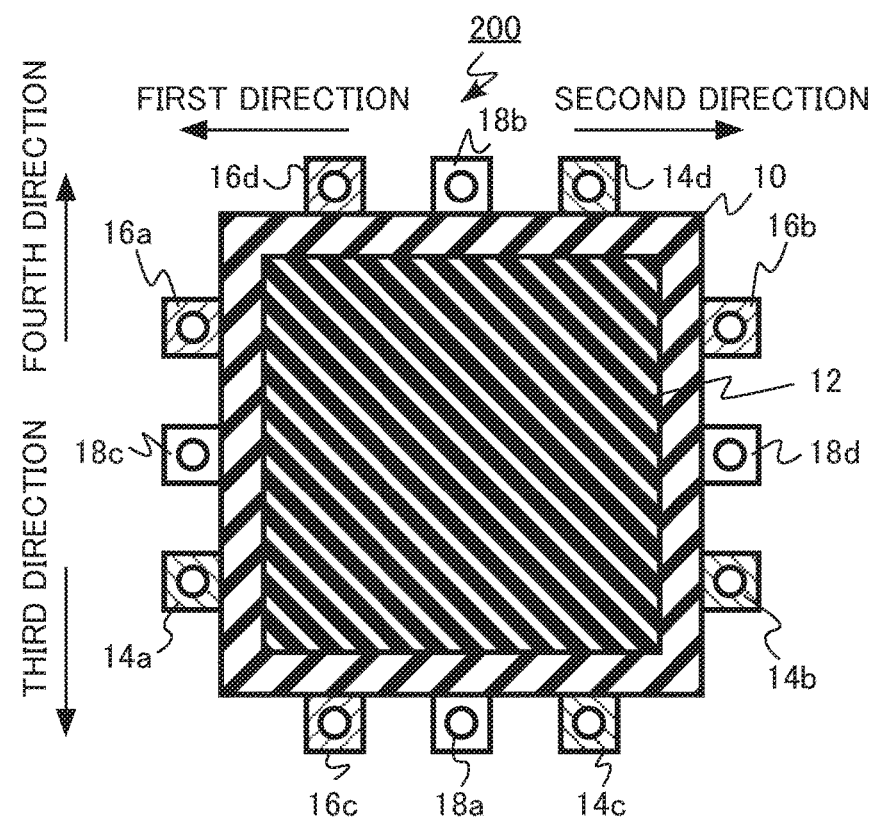
FIG. 6 is a schematic top view of a semiconductor device according to a second embodiment.
Figure 7A:
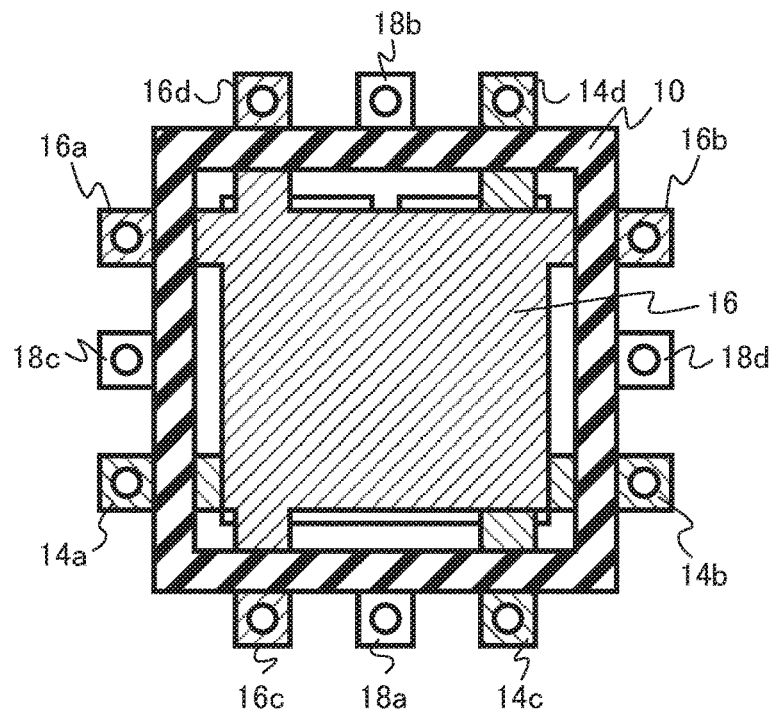
FIGS. 7A and 7B are schematic top views of the semiconductor device according to the second embodiment.
Figure 7B:
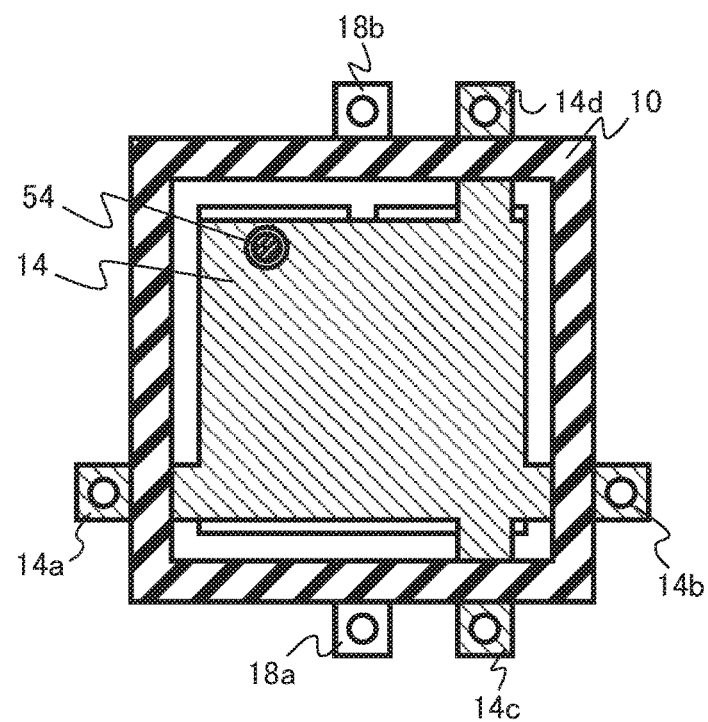

FIG. 6 and FIGS. 7A and 7B are schematic top views of the semiconductor device according to the second embodiment.

A power semiconductor module 200 of the second embodiment includes a resin case 10 (frame), cap 12, N electrode 14 (first polarity electrode), first N-terminal 14a (primary first polarity terminal), second N-terminal 14b (secondary first polarity terminal), third N-terminal 14c (tertiary first polarity terminal), fourth N-terminal 14d (quaternary first polarity terminal), P electrode 16 (second polarity electrode), first P-terminal 16a (primary second polarity terminal), second P-terminal 16b (secondary second polarity terminal), third P-terminal 16c (tertiary second polarity terminal), fourth P-terminal 16d (quaternary second polarity terminal), first AC output terminal 18a (output terminal), second AC output terminal 18b, third AC output terminal 18c, fourth AC output terminal 18d, metallic substrate 22, insulating substrate 24 (substrate), first metallic layer 26, second metallic layer 28, third metallic layer 30, MOSFET 38 (first semiconductor chip), MOSFET 40 (second semiconductor chip), bonding wire 42, silicone gel 44, first metallic plug 52, and second metallic plug 54.

FIG. 6 is a top view of the power semiconductor module 200. FIG. 7A is a top view of the power semiconductor module 200 without the cap 12 and the silicone gel 44. FIG. 7B is a top view of the power semiconductor module 200 without the cap 12, P electrode 16 (second polarity electrode), and silicone gel 44.

The N electrode 14 has a plate-like shape. The N electrode 14 includes the first N-terminal 14a, second N-terminal 14b, third N-terminal 14c, and fourth N-terminal 14d. A part of the N electrode 14 is provided inside the resin case 10. A part of the N electrode 14 is surrounded by the silicone gel 44.

The first N-terminal 14a is provided outside the resin case 10. The first N-terminal 14a extends in a first direction with respect to the resin case 10.

The second N-terminal 14b is provided outside the resin case 10. The second N-terminal 14b extends in a second direction, opposite to the first direction, with respect to the resin case 10.

The third N-terminal 14c is provided outside the resin case 10. The third N-terminal 14c extends in the third direction, perpendicular to the first direction, with respect to the resin case 10.

The fourth N-terminal 14d is provided outside the resin case 10. The fourth N-terminal 14d extends in the fourth direction, opposite to the third direction, with respect to the resin case 10.

The P electrode 16 has a plate-like shape. The P electrode 16 includes the first P-terminal 16a, second P-terminal 16b, third P-terminal 16c, and fourth P-terminal 16d. A part of the P electrode 16 is provided inside the resin case 10. A part of the P electrode 16 is surrounded by the silicone gel 44.

The first P-terminal 16a is provided outside the resin case 10. The first P-terminal 16a extends in the first direction with respect to the resin case 10.

The second P-terminal 16b is provided outside the resin case 10. The second P-terminal 16b extends in the second direction, opposite to the first direction, with respect to the resin case 10.

The third P-terminal 16c is provided outside the resin case 10. The third P-terminal 16c extends in the third direction, perpendicular to the first direction, with respect to the resin case 10.

The fourth P-terminal 16d is provided outside the resin case 10. The fourth P-terminal 16d extends in the fourth direction, opposite to the third direction, with respect to the resin case 10.

FIG. 8 is an explanatory view of function and effect of the semiconductor device according to the second embodiment. FIG. 8 is a schematic top view when three power semiconductor modules 200 are connected in parallel.

As shown in FIG. 8, the power semiconductor modules 200 are connectable to each other in any of the first, second, third, and fourth directions without a bus bar. Such a configuration improves the degree of freedom in layout of the circuit including the power semiconductor modules 200.

It should be noted that when connecting the power semiconductor modules 200 to each other, for example, the height of the first AC output terminal 18a and the second AC output terminal 18b or the height of the third AC output terminal 18c and the fourth AC output terminal 18d may be adjusted so that those pairs of AC output terminals do not come into contact with each other.

As described above, according to the second embodiment, it is possible to achieve effects similar to the first embodiment and to improve the degree of freedom in layout of the circuit including the power semiconductor modules 200.

Third Embodiment

A semiconductor device of a third embodiment is different from the semiconductor device according to the first embodiment in that at least one of the first and second polarity electrodes has a stripe pattern or a mesh pattern. Hereinafter, contents overlapping with the first embodiment will not be described.

Figure 9A:
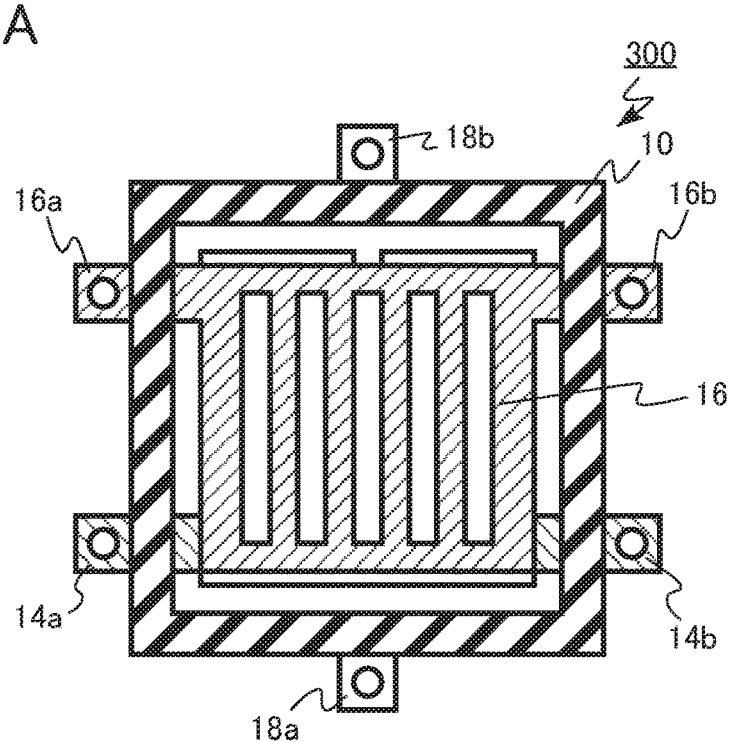
FIGS. 9A and 9B are schematic top views of a semiconductor device according to a third embodiment.
Figure 9B:
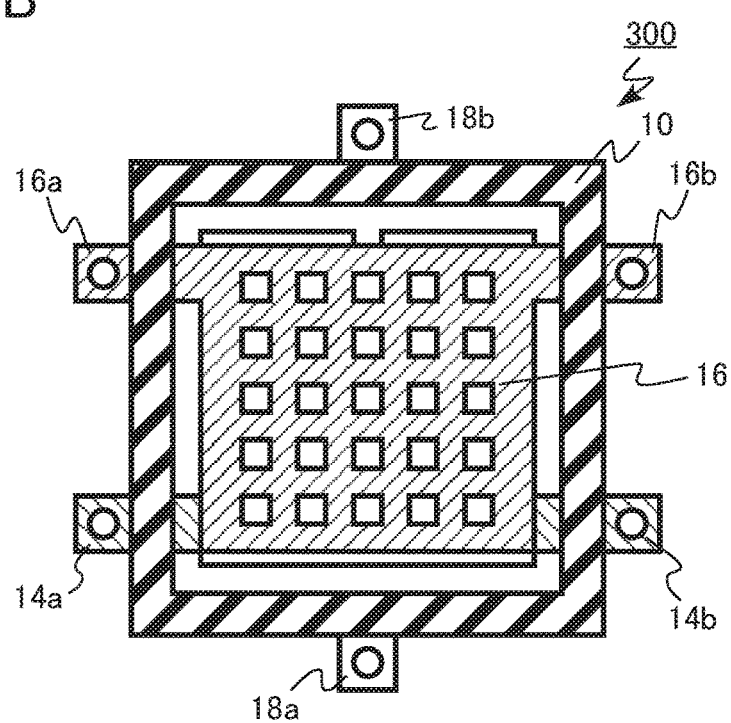

FIGS. 9A and 9B are schematic top views of the semiconductor device of the third embodiment. FIGS. 9A and 9B are top views of a power semiconductor module 300 without a cap 12 and a silicone gel 44.

A P electrode 16 in FIG. 9A has a stripe pattern. The P electrode 16 in FIG. 9B has a mesh pattern.

Although not shown, an N electrode 14 may also have a stripe pattern or a mesh pattern.

In each power semiconductor module 300, at least one of the N electrode 14 and the P electrode 16 has a stripe pattern or a mesh pattern. This makes it possible to reduce stress caused by temperature change. Specifically, internal stress of the resin case 10 and stress at connection portions of the terminals are reduced. Such a configuration leads to achievement of a highly reliable circuit that includes the power semiconductor modules 300.

As described above, according to the third embodiment, it is possible to achieve effects similar to the first embodiment and to improve the reliability of the circuit including the power semiconductor modules 300.

Fourth Embodiment

A semiconductor device of a fourth embodiment is different from the semiconductor device according to the first embodiment in that an insulating layer having permittivity higher than that of a silicone gel is provided between a first polarity electrode and a second polarity electrode. Hereinafter, contents overlapping with the first embodiment will not be described.

Figure 10:
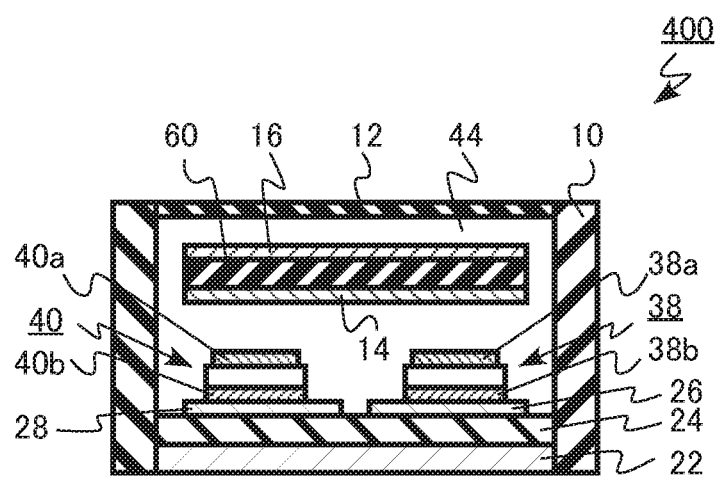
FIG. 10 is a schematic sectional view of a semiconductor device according to a fourth embodiment.

FIG. 10 is a schematic cross-sectional view of the semiconductor device of the fourth embodiment. FIG. 10 is a cross-sectional view corresponding to FIG. 3C of the first embodiment.

In a power semiconductor module 400, an insulating layer 60 having permittivity higher than that of the silicone gel is provided between an N electrode 14 and a P electrode 16. The insulating layer 60 includes, for example, fluororesin, polyimide, or epoxy resin.

Since the insulating layer 60 having the permittivity higher than that of the silicone gel is provided between the N electrode 14 and the P electrode 16, each power semiconductor module 400 is capable of reducing inductance inside the power semiconductor module 400. Accordingly, the inductance of the circuit including the power semiconductor modules 400 is reduced.

As described above, according to the fourth embodiment, it is possible to further reduce the inductance of the circuit including the power semiconductor modules 400, as compared with the first embodiment.

Fifth Embodiment

A semiconductor device according to a fifth embodiment is different from the semiconductor device according to the first embodiment in that a frame has a protrusion in the first direction and a recess in the second direction, in which the protrusion is provided with a primary first polarity terminal and a primary second polarity terminal and the recess is provided with a secondary first polarity terminal and a secondary second polarity terminal. Hereinafter, contents overlapping with the first embodiment will not be described.

A power semiconductor module 500 of the fifth embodiment includes a resin case 10 (frame), cap 12, N electrode 14 (first polarity electrode), first N-terminal 14a (primary first polarity terminal), second N-terminal 14b (secondary first polarity terminal), P electrode 16 (second polarity electrode), first P-terminal 16a (primary second polarity terminal), second P-terminal 16b (secondary second polarity terminal), first AC output terminal 18a (output terminal), second AC output terminal 18b, metallic substrate 22, insulating substrate 24 (substrate), first metallic layer 26, second metallic layer 28, third metallic layer 30, MOSFET 38 (first semiconductor chip), MOSFET 40 (second semiconductor chip), bonding wire 42, silicone gel 44, first metallic plug 52, and second metallic plug 54.

Figure 11A:
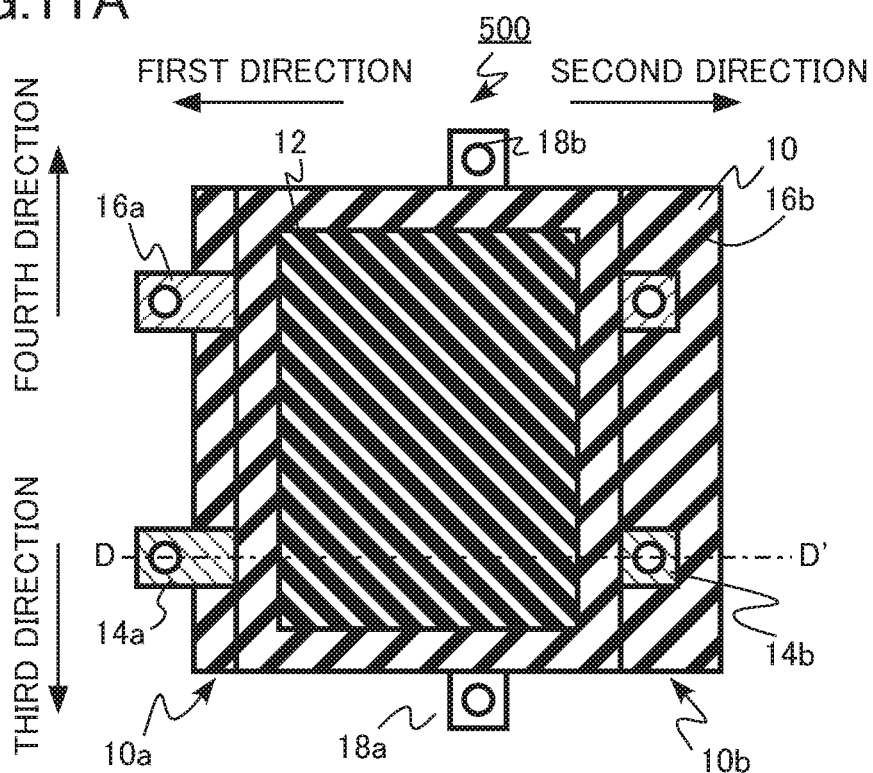
FIGS. 11A and 11B are schematic views of a semiconductor device according to a fifth embodiment.
Figure 11B:
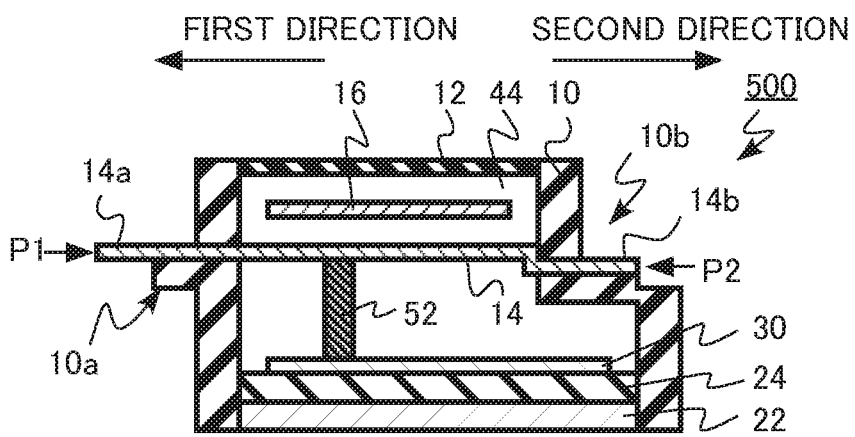

FIGS. 11A, 11B, and 11C are schematic views of the semiconductor device of the fifth embodiment. FIG. 11A is a top view of the power semiconductor module 500. FIG. 11B is a cross-sectional view taken along line DD' of FIG. 11A.

The resin case 10 includes a protrusion 10a and a recess 10b. The protrusion 10a is provided in the first direction of the resin case 10. The recess 10b is provided in the second direction of the resin case 10.

The protrusion 10a is provided with the first N-terminal 14a and the first P-terminal 16a. The recess 10b is provided with the second N-terminal 14b and the second P-terminal 16b.

Figure 12A:
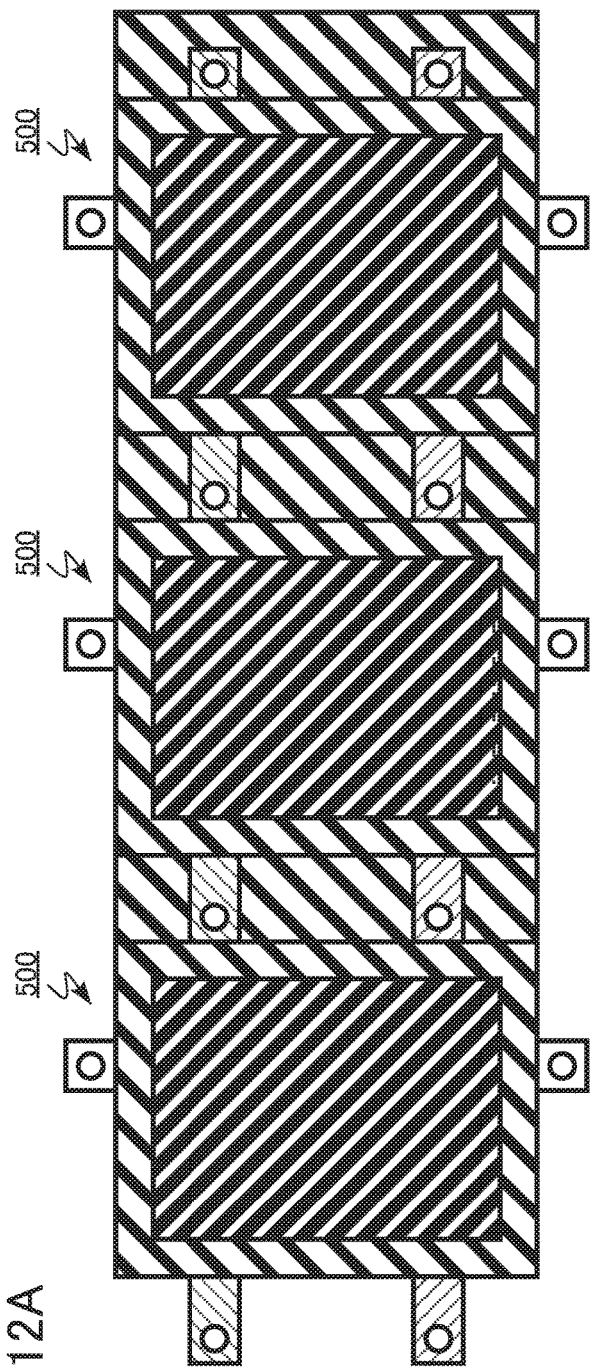
FIGS. 12A and 12B are explanatory views of function and effect of the semiconductor device according to the fifth embodiment.
Figure 12B:
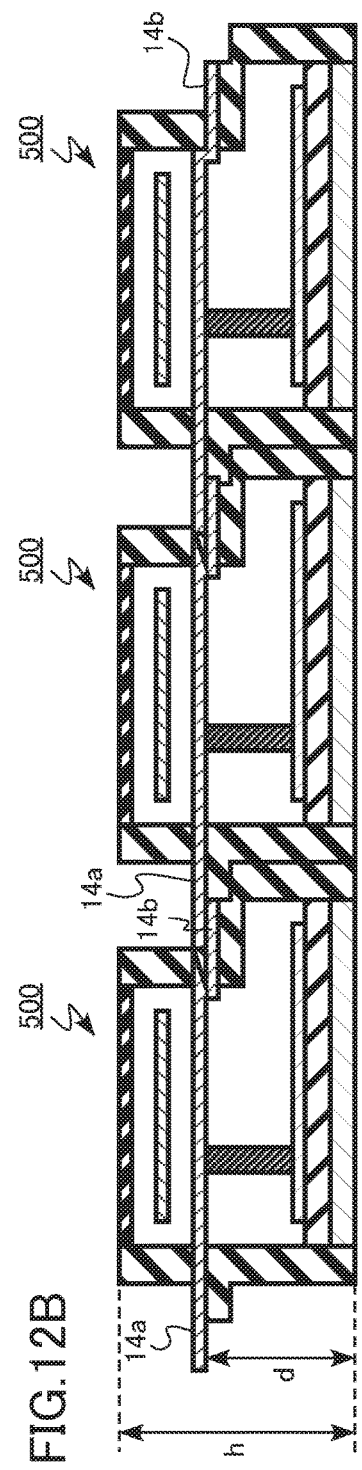

FIGS. 12A and 12B are explanatory views of function and effect of the semiconductor device according to the fifth embodiment. FIG. 12A is a schematic top view when three power semiconductor modules 500 are connected in parallel. FIG. 12B is a schematic cross-sectional view when three power semiconductor modules 500 are connected in parallel. FIG. 12B is a cross-sectional view corresponding to FIG. 11B.

A semiconductor module requires spatial insulation of terminals inside a circuit. For example, a certain insulation distance (d in FIG. 12B) is required for insulation between the first N-terminal 14a and a member to which a lower face of the semiconductor module is fixed. An increase in breakdown voltage required for the semiconductor module requires an increase in insulation distance d. The increase in insulation distance d increases the height of the semiconductor module (h in FIG. 12B), which also increases the size of the circuit that includes the semiconductor modules.

When connecting the power semiconductor modules 500 to each other, as shown in FIG. 12B, the protrusion 10a of the adjacent power semiconductor modules 500 is fitted in the recess 10b. Such a configuration elongates, for example, an insulation distance of the resin case 10 between the first N-terminal 14a and the member to which the lower face of the power semiconductor module 500 is fixed. In other words, since the resin case 10 is present between the first N-terminal 14a and the member to which the lower face of the power semiconductor module 500 is fixed, there is no space between those members, which elongates an effective insulation distance of the first N-terminal 14a. The second N-terminal 14b, first P-terminal 16a, and second P-terminal 16b similarly have an effective long insulation distance.

Such a configuration improves the breakdown voltage of each power semiconductor module 500. In other words, even with a short insulation distance d and a low height h of the power semiconductor module 500, a desired breakdown voltage is obtained. Accordingly, the circuit including the power semiconductor modules 500 is downsized.

As described above, according to the fifth embodiment, it is possible to achieve effects similar to the first embodiment and to downsize the circuit including the power semiconductor modules 500.

In the first to fifth embodiments, each semiconductor module is illustrated as the "2-in-1" module, but the semiconductor module may be other than the "2-in-1" module.

In the first to fifth embodiments, each semiconductor chip is illustrated as the MOSFET, but the semiconductor chip is not limited thereto. For example, other transistors and diodes such as an IGBT, a Schottky barrier diode (SBD), and a PIN diode are employable. A combination of a transistor and a diode is also employable.

In the first to fifth embodiments, two semiconductor chips are provided in each power semiconductor module. However, for example, three or more semiconductor chips may be provided in each power semiconductor module.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a frame;
   a substrate provided inside the frame;
   a first semiconductor chip provided on the substrate and including a first upper electrode, a first lower electrode, and a first gate electrode;
   a first polarity electrode having a plate-like shape with a part being provided inside the frame and including a primary first polarity terminal provided outside the frame extending in a first direction, and a secondary first polarity terminal provided outside the frame extending in a second direction opposite to the first direction; and
   a second polarity electrode having a plate-like shape facing the first polarity electrode with a part being provided inside the frame and including a primary second polarity terminal provided outside the frame extending in the first direction, and a secondary second polarity terminal provided outside the frame extending in the second direction.

2. The semiconductor device according to claim 1, further comprising:
   a second semiconductor chip provided on the substrate and including a second upper electrode, a second lower electrode, and a second gate electrode; and
   an output terminal provided outside the frame,
   wherein the first polarity electrode is electrically connected to the first upper electrode,
   the second polarity electrode is electrically connected to the second lower electrode, and
   the output terminal is electrically connected to the first lower electrode and the second upper electrode.

3. The semiconductor device according to claim 1,
   wherein the first polarity electrode includes a tertiary first polarity terminal provided outside the frame extending in a third direction perpendicular to the first direction, and a quaternary first polarity terminal provided outside the frame extending in a fourth direction opposite to the third direction, and
   the second polarity electrode includes a tertiary second polarity terminal provided outside the frame extending in the third direction, and a quaternary second polarity terminal provided outside the frame extending in the fourth direction.

4. The semiconductor device according to claim 1, wherein at least one of the first polarity electrode and the second polarity electrode has a stripe pattern or a mesh pattern.

5. The semiconductor device according to claim 1, wherein an insulating layer having permittivity higher than permittivity of silicone gel is provided between the first polarity electrode and the second polarity electrode.

6. The semiconductor device according to claim 1, wherein the frame has a protrusion in the first direction and a recess in the second direction, the protrusion being provided with the primary first polarity terminal and the primary second polarity terminal, and the recess being provided with the secondary first polarity terminal and the secondary second polarity terminal.

7. The semiconductor device according to claim 1, wherein the primary first polarity terminal and the secondary first polarity terminal are on two different planes both having a normal line of the substrate, and the primary second polarity terminal and the secondary second polarity terminal are on two different planes both having a normal line of the substrate.

8. The semiconductor device according to claim 1, wherein inside of the frame is filled with silicone gel.

9. The semiconductor device according to claim 5, wherein an inside of the frame is filled with silicone gel.

10. The semiconductor device according to claim 1, wherein the first semiconductor chip is a MOSFET or an IGBT.

11. The semiconductor device according to claim 1, wherein the frame includes resin.

* * * * *